United States Patent [19]

Kosky et al.

[11] Patent Number: 5,397,396
[45] Date of Patent: Mar. 14, 1995

[54] APPARATUS FOR CHEMICAL VAPOR DEPOSITION OF DIAMOND INCLUDING THERMAL SPREADER

[75] Inventors: Philip G. Kosky; Erik O. Einset, both of Niskayuna; David W. Woodruff, Clifton Park, all of N.Y.

[73] Assignee: General Electric Company, Schenectady, N.Y.

[21] Appl. No.: 172,797

[22] Filed: Dec. 27, 1993

[51] Int. Cl.⁶ .................................................. C23C 16/00
[52] U.S. Cl. .................................... 118/924; 118/725
[58] Field of Search ............... 117/929; 118/725, 724; 427/249, 577; 423/446

[56] References Cited

U.S. PATENT DOCUMENTS

| | | | |
|---|---|---|---|
| 4,953,499 | 9/1990 | Anthony et al. | 118/724 |
| 5,023,109 | 6/1991 | Chin et al. | 427/577 |
| 5,071,677 | 12/1991 | Patterson et al. | 427/249 |
| 5,160,544 | 11/1992 | Garg et al. | 118/724 |
| 5,314,570 | 5/1994 | Ikegaya et al. | 117/929 |
| 5,340,401 | 8/1994 | Cann | 118/725 |

*Primary Examiner*—Olik Chaudhuri
*Assistant Examiner*—Brian K. Dutton
*Attorney, Agent, or Firm*—William H. Pittman

[57] ABSTRACT

Temperature uniformity and control in apparatus for chemical vapor deposition of diamond is improved by contacting the rear of the substrate assembly, which may be a substrate or a holder containing substrates, with a thermal spreader, preferably of copper and preferably having heating means embedded therein or associated therewith. The thermal spreader contacts a thermal resistance unit, preferably of stainless steel, which in turn is in contact with a cooling element that preferably has coolant passages therein.

15 Claims, 1 Drawing Sheet

APPARATUS FOR CHEMICAL VAPOR DEPOSITION OF DIAMOND INCLUDING THERMAL SPREADER

FIELD OF THE INVENTION

This invention relates to the production of diamond by chemical vapor deposition, and more particularly to apparatus for optimizing the quality and consistency of diamond so produced.

Diamond production by chemical vapor deposition (hereinafter sometimes "CVD") is well known. It involves activation at relatively low pressure of a mixture of hydrogen and a gaseous hydrocarbon followed by passage of the gaseous mixture into contact with a substrate. The hydrogen gas is converted to atomic hydrogen which reacts with the hydrocarbon to form active gaseous carbon species, which in turn adsorb on the substrate and react to form polycrystalline diamond. A number of types of activation may be employed, including thermal activation which, in the "filament method", is effected by means of one or more wires or filaments heated to at least 1800° C.

While filament temperatures this high are required for activation, optimum CVD rates are achieved at a substrate temperature in the range of about 700°–1000° C. For small, one filament deposition systems, the substrate is typically cooled to a temperature within the optimum range by passive means.

To achieve economy of scale, large area substrates are often employed. For large area deposition, an array of filaments is employed. This may have numerous disadvantages. The additional filaments may overheat the substrate to a temperature beyond the preferred diamond deposition temperature. Therefore, the substrate is typically cooled to a temperature within the optimum range by proximity to a water-cooled heat sink, "proximity" often meaning a distance between the substrate and heat sink on the order of 1 mm.

Another disadvantage is the wide variation of substrate temperature, which may be greater than 150° C. over the surface of the substrate with the higher temperatures being observed near its center and the lower temperatures at its edges. Such variations exist even when a plurality of filaments along the entire width of the substrate is employed and can cause variation up to a factor of 4 in the thickness of the diamond layer produced on the substrate. Thus, it is difficult or impossible to produce diamond across the entire substrate having a consistent thickness.

Another problem is a result of the thermal expansion of the substrate. If a 1-mm. space is maintained between the substrate and the heat sink at the beginning of the operation, thermal expansion of the substrate during the CVD operation will inevitably distort that gap. Even if a moveable heat sink is provided, it is difficult to observe the gap and adjust it appropriately. Moreover, the temperature variations along the surface of the substrate typically result in non-uniform expansion thereof and inconsistency of the gap width.

Another problem arises in case of breakage of one or more filaments. Since the filaments are the only heat source for the substrate, filament breakage exacerbates the temperature difference across the substrate surface. A diamond layer formed on a substrate may be so inconsistent in thickness and quality as to be useless in the case of filament breakage.

DESCRIPTION OF THE RELATED ART

*Chemical and Engineering News*, 67(20), 24–39 (May 15, 1989), is a review of methods of CVD of diamond. The use of multiple filaments and a heat sink is disclosed in U.S. Pat. No. 4,953,499.

SUMMARY OF THE INVENTION

The present invention is an apparatus for CVD of diamond by the filament method which optimizes uniformity of substrate temperature, leading to more consistent diamond thickness than has hitherto been possible. In a preferred embodiment, it also makes possible substrate temperature control independent of filament temperature, whereby said substrate temperature may be maintained within the optimum deposition range and the filaments at the same time heated to the optimum activation temperature for the gaseous hydrogen-hydrocarbon mixture. Control of the substrate temperature may be so closely regulated that a useable product is obtained even upon failure of one or more filaments.

The invention is apparatus for preparation of diamond by chemical vapor deposition, comprising:
 at least one heating filament;
 at least one substrate assembly including a substrate capable of receiving deposited diamond, said assembly having a front diamond-receiving side and a rear side;
 a thermal spreader of a metal having a thermal conductivity of at least about 0.5 W/cm°C., said thermal spreader having a front side and a rear side and the front side thereof being in contact with said rear side of said substrate assembly;
 a thermal resistance unit of a high temperature resistant material having a thermal conductivity of at most about 0.3 W/cm°C., said thermal resistance unit having a front side and a rear side and the front side thereof being in contact with said rear side of said thermal spreader; and
 a cooling element in contact with said rear side of said thermal resistance unit, said cooling element being of a metal having a thermal conductivity of at least about 0.5 W/cm°C.

GENERAL DESCRIPTION; PREFERRED EMBODIMENTS

The present invention is associated with conventional features of a CVD unit for diamond. Such conventional features include a reaction chamber which is vacuum-tight and thus capable of being maintained at reduced pressure, fitted with suitable gas inlets and exhaust ports. All portions of the apparatus which are present in the reaction chamber are constructed of suitable heat-resistant materials, as necessary to withstand exposure to filament temperatures on the order of 2000° C. and substrate temperatures up to about 1000° C. Quartz, for example, is an illustrative non-conductive heat-resistant material suitable for said chamber. All of the elements hereinafter described are present in said chamber.

Figure 1:
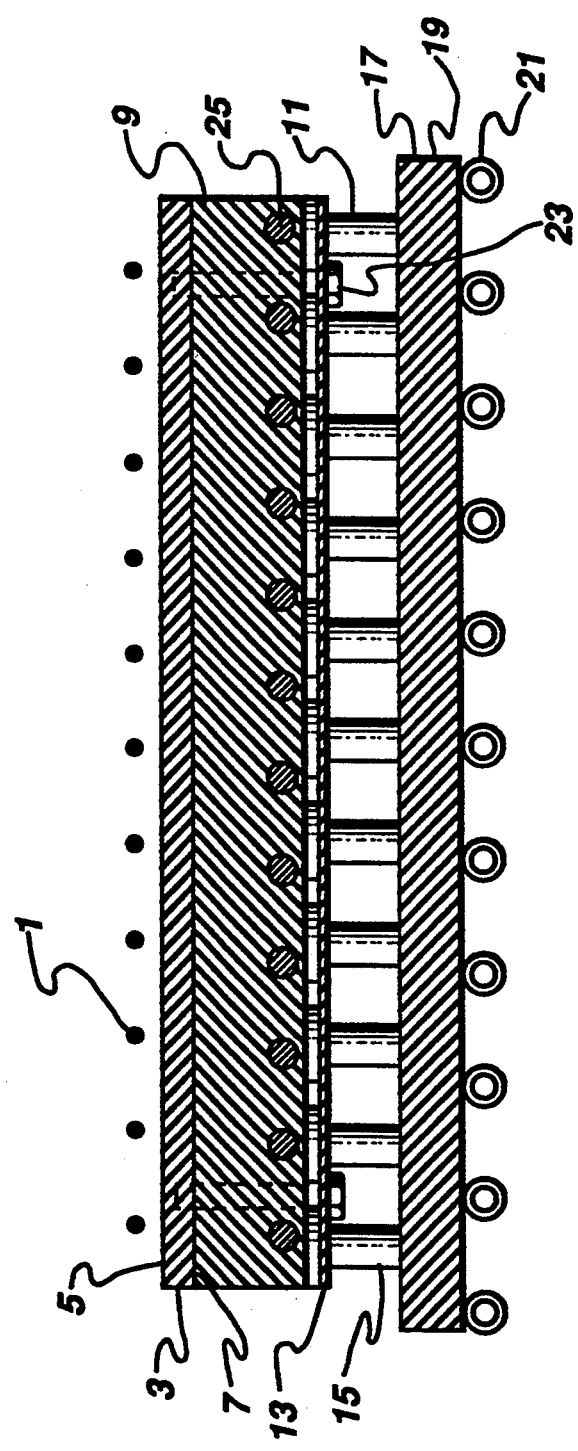
FIG. 1 is a cross-sectional view of the apparatus of this invention in one of its preferred embodiments, incorporating one design of the substrate assembly which is an element of the invention.

Reference is made to FIG. 1 which, as previously noted, is a cross-sectional view of typical apparatus according to the invention. The substrate and filaments depicted therein may be vertically or horizontally disposed, and the drawing may be considered a top view of an apparatus in which they are vertically disposed.

A number of heated filaments, one of which is designated 1, are shown and are generally preferred, although apparatus employing a single filament is within the scope of the invention. Illustrative heat-resistant filament materials are metallic tungsten, tantalum, molybdenum and rhenium; because of its relatively low cost and particular suitability, tungsten is often preferred. Filament diameters of about 0.2–1.0 mm. are typical, with about 0.4–0.8 mm. frequently being preferred.

Substrate assembly 3 is shown as having a planar rear surface, and this shape is preferred although other shapes may be employed if the remainder of the apparatus of the invention is configured accordingly. It is also shown in FIG. 1 as consisting of a flat plate which is itself the substrate.

Any refractory substrate material suitable for diamond deposition thereon may be employed. Examples of such materials are carbide formers such as molybdenum, silicon, tantalum and niobium as well as combinations thereof (including coatings on other refractory materials). Metallic molybdenum substrates are particularly suitable and are generally preferred.

The size of the substrate assembly is not critical but may be varied according to economies of scale or the size of the diamond article required. Overall length and width dimensions on the order of $3 \times 3$ to $30 \times 20$ cm. are typical. The thickness of a molybdenum substrate may, for example, be in the range of about 5–20 mm.; other substrates of lower thermal conductivities should be correspondingly thinner than molybdenum substrates.

Figure 2:
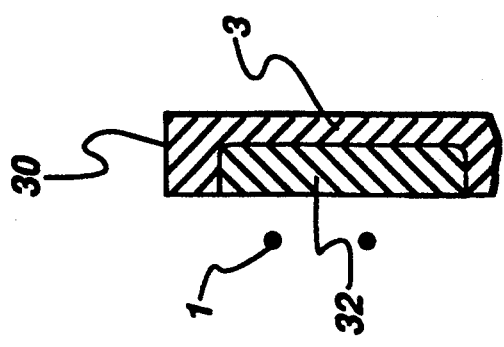
FIG. 2 is a cross-sectional view of another design of the substrate assembly.

An alternative design of substrate assembly 3 is shown, together with filaments 1, in FIG. 2. It comprises substrate holder 30, typically of graphite, with at least one substrate 32 mounted therein. A substrate holder configured to hold several substrates may be employed. This type of substrate assembly is disclosed in detail in copending, commonly owned application Ser. No. 08/96,392, the disclosure of which is incorporated by reference herein. Individual substrate sizes therein are typically on the order of 2.5 cm. square.

The substrate assembly has front side 5 which will receive the diamond and rear side 7. Said rear side is in contact with the front side of thermal spreader 9, which is of a metal having a thermal conductivity of at least about 0.5 W/cm°C. Illustrative metals are copper, molybdenum and nickel. Alloys of said metals may also be employed, provided they have the requisite thermal conductivity. Copper is generally preferred since it has a very high conductivity (about 4 W/cm°C.) and is relatively inexpensive.

The principal purpose of thermal spreader 9 is to promote temperature uniformity over the entire surface of substrate 3. Heating means associated therewith, disclosed in detail hereinafter, may serve the further purpose of assisting in maintenance of the temperature of the substrate within the optimum range for diamond deposition.

The thickness of the thermal spreader is adjusted to provide the desired uniformity of temperature of the substrate, according to principles which will be apparent to those skilled in the art. A copper block with a thickness in the range of about 10–50 mm. is illustrative.

In a highly preferred embodiment of the invention, thermal spreader 9 has heating means embedded therein or adjacent thereto (e.g., between said thermal spreader and the thermal resistance unit). In FIG. 1, a plurality of cartridge heaters, one of which is designated 25, is shown; said heaters may be on the order of 5–20 mm. in diameter and are connected by suitable wiring (not shown) to a temperature control unit. A temperature measuring device of conventional design may be located in contact with the substrate.

Thermal resistance unit 11 is shown in contact with the rear side of thermal spreader 9. It is of a high temperature resistant material having a relatively low thermal conductivity, at most about 0.3 W/cm°C. Suitable materials for this purpose include metals and refractories. Among the suitable metals are stainless steel and various alloys of nickel and other metals such as copper, iron, chromium and manganese. Commercially available alloys of this type are sold under the tradenames HASTELLOY, INCONEL and MONEL. Stainless steel, having a thermal conductivity of about 0.2 W/cm°C., is generally preferred.

It is possible for thermal resistance unit 11 to be a simple plate or block. However, this is generally not preferred since a very thick plate, greater than 10 cm., would be required to provide the necessary temperature drop between the thermal spreader and the cooling element. More often, the thermal resistance unit is constructed with a patterned contact area with the cooling element described hereinafter.

In a highly preferred embodiment, thermal resistance member 11 is of a patterned metal, the patterning being chosen to provide the required resistance to the flow of heat such that the substrate temperature is at or below the preferred range. The pattern depends on three parameters: the thermal conductivity of the material, its cross-sectional area in contact with the thermal spreader, and its net thickness. The contact area is preferably distributed uniformly over the rear side of thermal spreader 9. Typically, the net thermal conductivity of the material may be thus reduced by a factor of 10 or more.

One relatively simple construction of thermal resistance unit 11, shown in the drawing, is capable of construction with a stainless steel plate and a number of rivets. The plate, designated 13, has a plurality of holes distributed evenly over its entire area to accommodate rivets, one of which is designated 15, typically having flat heads as shown. The rivets are press-fitted into plate 13 and the assemblage thus constructed is employed as the thermal resistance unit. Equivalent designs, which may, for example, be produced by machining a steel plate, may also be employed.

As shown, the heads of rivets 15 form the contact points with thermal spreader 9. The other ends of said rivets contact cooling element 17. The latter is similar to the thermal spreader in that it is of a metal with a relatively high thermal conductivity, namely at least about 0.5 W/cm°C. It may have passages therein or intimately attached cooling coils for a coolant such as water.

In FIG. 1 the cooling element is shown as including front plate 19 and coolant coils 21, but any other suitable construction may be employed. It is strongly preferred that cooling element 17 have a flat front side as shown in the figure, to maximize contact area with the rear side of thermal resistance unit 11.

It is within the scope of the invention for substrate assembly 3, thermal spreader 9 and thermal resistance unit 11 to be separately constructed and merely placed in contact in the CVD diamond chamber. In a preferred embodiment, however, they are fastened together for stability. The embodiment shown in the drawing employs bolts, one of which is designated 23, as fasteners. Tensioning devices such as lock washers (not shown) may be employed to accommodate expansion and contraction on heating and cooling. Any suitable type of bolt may be employed, with the proviso that it should not penetrate the front side of substrate assembly 3 so as not to interfere with diamond deposition. Other means of fastening, such as brazing, may alternatively be employed.

When heating means 25 are employed in thermal spreader 9, it is unnecessary to maintain filaments 1 at a temperature which provides all the required heat to heat substrate assembly 3. The filament temperature may be independently adjusted, and the output of cartridge heaters 25 regulated so as to maintain substrate assembly 3 within the optimum range which is generally about 700°–1000° C. Typically, the design of thermal resistance unit 11 is such that a temperature of about 700° C. is imparted solely by filament heating to substrate assembly 3.

A diamond-producing run employed a rectangular molybdenum substrate 20.3×10.2×0.95 cm. and a copper heat spreader about 1.9 cm. in thickness. The thermal resistance unit was a stainless steel plate 0.8 mm. thick with rivets, 6.4 mm. in diameter and 11.1 mm. long, distributed over its area as shown in FIG. 1, providing a ratio of resistance unit contact area to total thermal spreader area of 1:6.44. Under diamond deposition conditions, the temperature difference across the substrate from corner to center was from about 775° to about 795° C., or only about 20° C. This is in contrast to the approximately 150° C. difference noted in the absence of the thermal spreader and thermal resistance unit. It was also noted, during the operation of said apparatus using a feedback temperature controller, that the temperature of the substrate fluctuated by only ±2° C. when the power to the filaments was decreased from 5 to 3.2 kW.

What is claimed is:

1. Apparatus for preparation of diamond by chemical vapor deposition, comprising:
    at least one heating filament;
    at least one substrate assembly including a substrate capable of receiving deposited diamond, said assembly having a front diamond-receiving side and a rear side;
    a thermal spreader of a metal having a thermal conductivity of at least about 0.5 W/cm°C., said thermal spreader having a front side and a rear side and the front side thereof being in contact with said rear side of said substrate assembly;
    a thermal resistance unit of a material having a thermal conductivity of at most about 0.3 W/cm°C., said thermal resistance unit having a front side and a rear side and the front side thereof being in contact with said rear side of said thermal spreader; and
    a cooling element in contact with said rear side of said thermal resistance unit, said cooling element being of a metal having a thermal conductivity of at least about 0.5 W/cm°C.

2. Apparatus according to claim 1 wherein the substrate assembly has a planar rear surface.

3. Apparatus according to claim 2 wherein the thermal resistance unit has a patterned area of contact with said cooling element.

4. Apparatus according to claim 3 wherein said area of contact is uniform.

5. Apparatus according to claim 3 further comprising a plurality of heating filaments.

6. Apparatus according to claim 5 wherein the thermal spreader is of copper.

7. Apparatus according to claim 5 wherein the thermal resistance unit is of metal.

8. Apparatus according to claim 7 wherein the thermal resistance unit is of stainless steel.

9. Apparatus according to claim 5 wherein the cooling element has coolant passages therein.

10. Apparatus according to claim 5 wherein the substrate assembly consists of a flat plate which is itself the substrate.

11. Apparatus according to claim 5 wherein the substrate assembly comprises a substrate holder with at least one substrate mounted therein.

12. Apparatus according to claim 5 wherein the substrate is of molybdenum.

13. Apparatus according to claim 5 wherein the thermal spreader has heating means therein or adjacent thereto.

14. Apparatus according to claim 13 wherein said heating means is embedded in said thermal spreader.

15. Apparatus according to claim 14 wherein said heating means comprises a plurality of cartridge heaters.

* * * * *